United States Patent
Kirihata

[19]

[11] Patent Number: 5,822,268
[45] Date of Patent: Oct. 13, 1998

[54] HIERARCHICAL COLUMN SELECT LINE ARCHITECTURE FOR MULTI-BANK DRAMS

[75] Inventor: Toshiaki Kirihata, Wappingers Falls, N.Y.

[73] Assignee: International Business Machines Corporation, Armonk, N.Y.

[21] Appl. No.: 927,158

[22] Filed: Sep. 11, 1997

[51] Int. Cl.$^6$ .................................................. G11C 8/00
[52] U.S. Cl. ............................ 365/230.03; 365/230.06; 365/63
[58] Field of Search ................... 365/230.03, 230.06, 365/189.03, 63, 149, 72

[56] References Cited

U.S. PATENT DOCUMENTS

| | | | |
|---|---|---|---|
| 4,482,984 | 11/1984 | Oritani | 365/154 |
| 5,499,215 | 3/1996 | Hatta | 365/230.03 |
| 5,502,675 | 3/1996 | Kohno et al. | 365/230.03 X |
| 5,544,113 | 8/1996 | Kirihata et al. | 365/200 |
| 5,715,209 | 2/1998 | Yoo | 365/230.03 |

OTHER PUBLICATIONS

Y. Watanabe, et al, "A 286 mm$^2$ 256 Mb DRAM with ×32 Both–Ends DQ" IEEE Journal of Solid–State Circuits, V. 31, #4, Apr. 1996, pp. 567–574.

T. Saeki, et al, "A 2.5–ns Clock Access, 250–MHz, 256–Mb SDRAM with Synchronous Mirror Delay" IEEE Journal of Solid–State Circuits, V. 31, #11, Nov. 1996, pp. 1656–1668.

Jei–Hwan Yoo, et al, "A 32–Bank 1 Gb Self–Strobing Synchronous DRAM with 1 GByte/s Bandwidth" IEEE Journal of Solid–State Circuits, V. 31, #11, Nov. 1996, pp. 1635–1644.

*Primary Examiner*—David Nelms
*Assistant Examiner*—Huan Hoang
*Attorney, Agent, or Firm*—H. Daniel Schnurmann

[57] ABSTRACT

A multi-bank DRAM having a hierarchical column select line architecture is described. The DRAM is provided with a plurality of memory cells which are organized in at least two banks. Each of the banks includes memory cells which are arranged in rows and columns. The memory cells store data provided by at least one bit line and at least one data line. The DRAM includes: a first switch for selecting one of the two banks; and a second switch connected to the first switch for selecting one of the columns, wherein the first and second switches couple one of the bit lines to one of the data lines, enabling data to be written into or read out of memory cells common to the selected bank and to the selected column. The first switch is controlled by a plurality of bank CSLs (BCSLs), wherein the BCSLs are shared by some of the blocks within the same bank, but not by any of the blocks in other banks. The second switch is controlled by a plurality of global CSLs (GCSLs), the GCSLs being shared by all remaining banks within a unit. The BCSLs and GCSLs are controlled by the bank column decoder and by the global column decoder.

19 Claims, 7 Drawing Sheets

HIERARCHICAL COLUMN SELECT LINE ARCHITECTURE FOR MULTI-BANK DRAMS

RELATED APPLICATIONS

This application is related to U.S. application Ser. No. 08/427,160 (Attorney Docket No. FI9-97-183), entitled "Method of Structuring a Multi-Bank DRAM into a Hierarchical Column Select Line Architecture", filed concurrently herewith, and assigned to the same assignee.

FIELD OF THE INVENTION

This invention relates generally to semiconductor memory devices, and more particularly, to a multi-bank dynamic random access memory having a hierarchical column select line architecture.

BACKGROUND OF THE INVENTION

CMOS technology has evolved such that the computer market has rapidly opened to a wide range of consumers. Today multi-media applications require at least an 8 MB and preferably even a 16 Mb memory, which increases the relative cost of the memory system within a computer. In the near future, it is likely that 32 MB and 64 MB computers will become commonplace, which suggests a potential demand for 256 Mb DRAMs (Dynamic Random Access Memory) and beyond. Still in the development stage, DRAMs in the Gigabit range are already under way.

DRAM architectures have evolved over the years driven by system requirements that necessitate larger memory capacity. The speed of a DRAM, characterized by its random access time (tRAC) and by its random access cycle time (tRC), however, has not improved in a like manner. This has created a large speed gap between the DRAMs and the CPU, particularly, since the speed of the clock of the CPU is consistently improving over time. In order to overcome this problem, a cache is now commonly used, not only for high-end workstations, but also for multimedia computers. A cache, however, requires fast and expensive SRAMs, increasing system cost. Furthermore, even with this expensive and complex cache, the system performance, particularly with large density memories, cannot be significantly enhanced in view of the high probability of a cache miss. It is therefore crucial, if the DRAM speed (i.e., tRAC and tRC) is to approach that of an SRAM, that the cache overhead be reduced or, preferably, ultimately eliminated.

The tRAC and the tRC in a DRAM are fundamentally slower than in an SRAM. This is because the amount of data stored in DRAM cells is small when compared to that stored in an SRAM. Therefore, small signals, which are characteristic of DRAMs, need to be amplified which, in turn, slows down tRAC. Moreover, the data that is read in a DRAM is destroyed and must be restored in order to initiate the next read or write operation, thereby slowing the tRC.

A multi-bank DRAM containing several independently controllable arrays within a chip, allows starting a next operation using the pipeline approach. This method is ideal for boosting tRC. By way of example, having two banks in a chip allows halving tRC. The tRAC of two consecutive random access operations are transparent to previous operations, since a next operation may start prior to a previous one being completed. It is because of these considerations that the concept of introducing multi-banks in a chip is of such importance for current and future systems. Such an architecture has already been used in several multi-bank DRAMs products, such as SDRAMs, RDRAMs, and MDRAMs. Designing multi-banks in a single chip, however, requires special handling when implementing this concept in a hierarchical Column Select Line (CSL) architecture, which is not found in a single-bank DRAM.

Figure 1A:
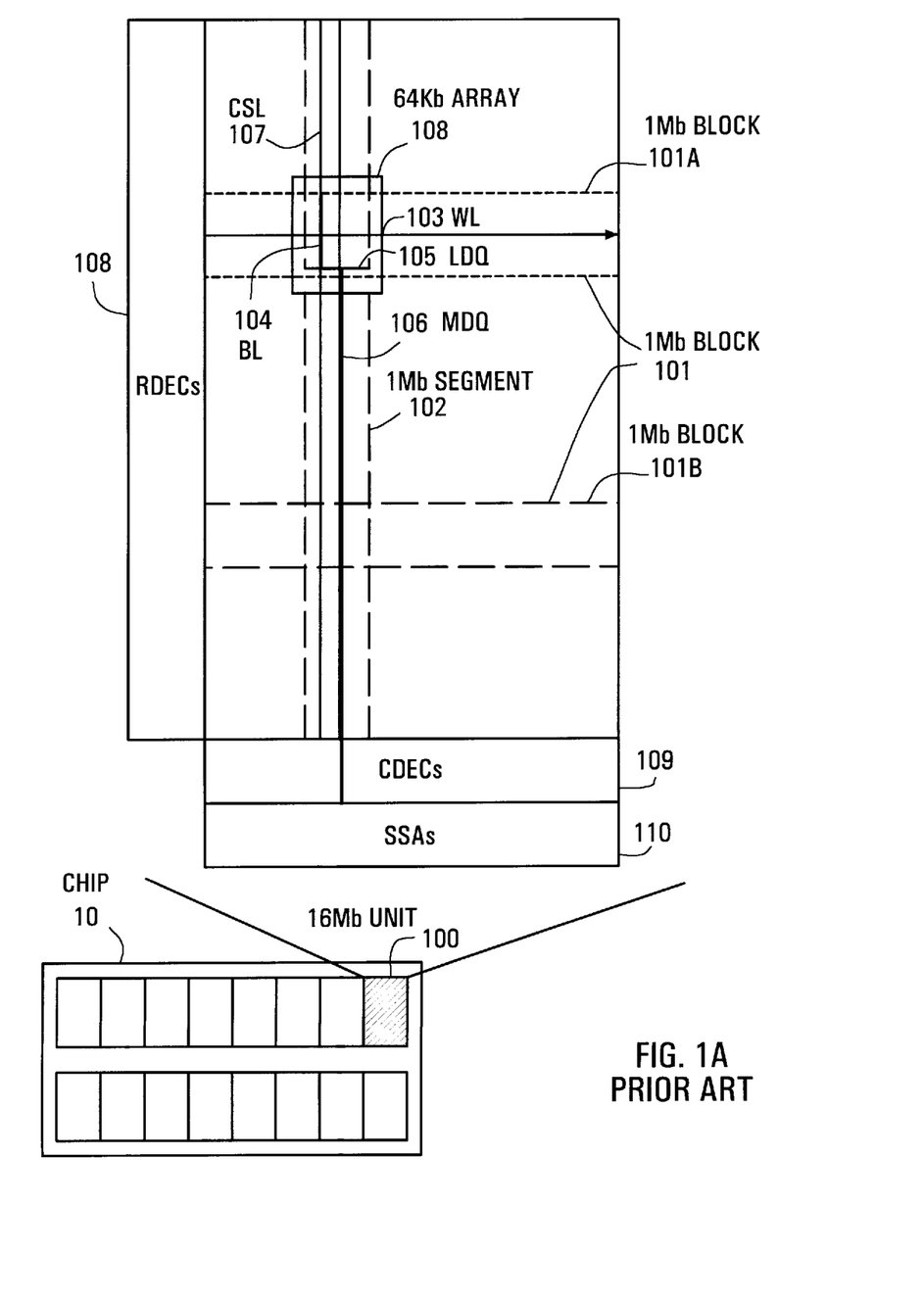
FIG. 1a is a schematic representation of a prior art single bank 256 Mb DRAM consisting of sixteen 16 Mb units sectioned into sixteen 1 Mb segments in the column direction, with its corresponding bitline pairs.

By way of example, and with reference to FIG. 1a, is depicted a Master-DQ (MDQ) architecture of a 256 Mb DRAM, allowing for a wide I/O organization with a small silicon area overhead. This architecture is more fully described in an article entitled: "A 286 mm$^2$ 256 Mb DRAM with x32 both-ends DQ", by Y. Watanabe et al., published in the IEEE Journal for Solid-State Circuits, Vol. 31, No. 4, pp. 567–574. This DRAM is configured as a "single bank" architecture, (a bank being defined as an array which can be independently controlled, and more specifically, wherein the next 'random access mode', in which the next wordline in a different bank needs to be activated, can be initiated before previous 'random access modes' have been completed).

Chip 10, shown in FIG. 1a, includes sixteen 16 Mb units 100, each consisting of sixteen 1 Mb blocks 101. Each 1 Mb block 101 contains 512 wordlines (WLs) 103 spanning in a horizontal direction, and 2048 bitline pairs (BLs) 104 spanning in a vertical direction. For simplicity sake, Row Decoders (RDECs) 108 are located at the left of each 16 Mb unit 100. The Column Decoders (CDECs) 109 and the second sense amplifiers (SSAs) 110 are placed at the bottom of each 16 Mb unit 100. For column direction, the 16 Mb unit 100 consists of sixteen 1 Mb segments 102. The 32 column select lines CSLs 107 and the 4 hierarchical data lines having local-DQ (LDQ) 105 and 4 master-DQ (MDQ) 106 are arranged over each 1 Mb segment 102. The intersection of 1 Mb block 101 and 1 Mb segment 102 contains 64 Kb array 108. In summary, the 1 Mb block 101 contains sixteen 64 Kb arrays 108, while the 1 Mb segment consists of sixteen 64 Kb arrays 108.

For clarity and simplicity sake, the discussion following hereinafter assumes only one of the sixteen 1 Mb block 101 to be active at any given time, the data of which is transferred with LDQ and MDQ to the corresponding 1 Mb segment 102.

Figure 1B:
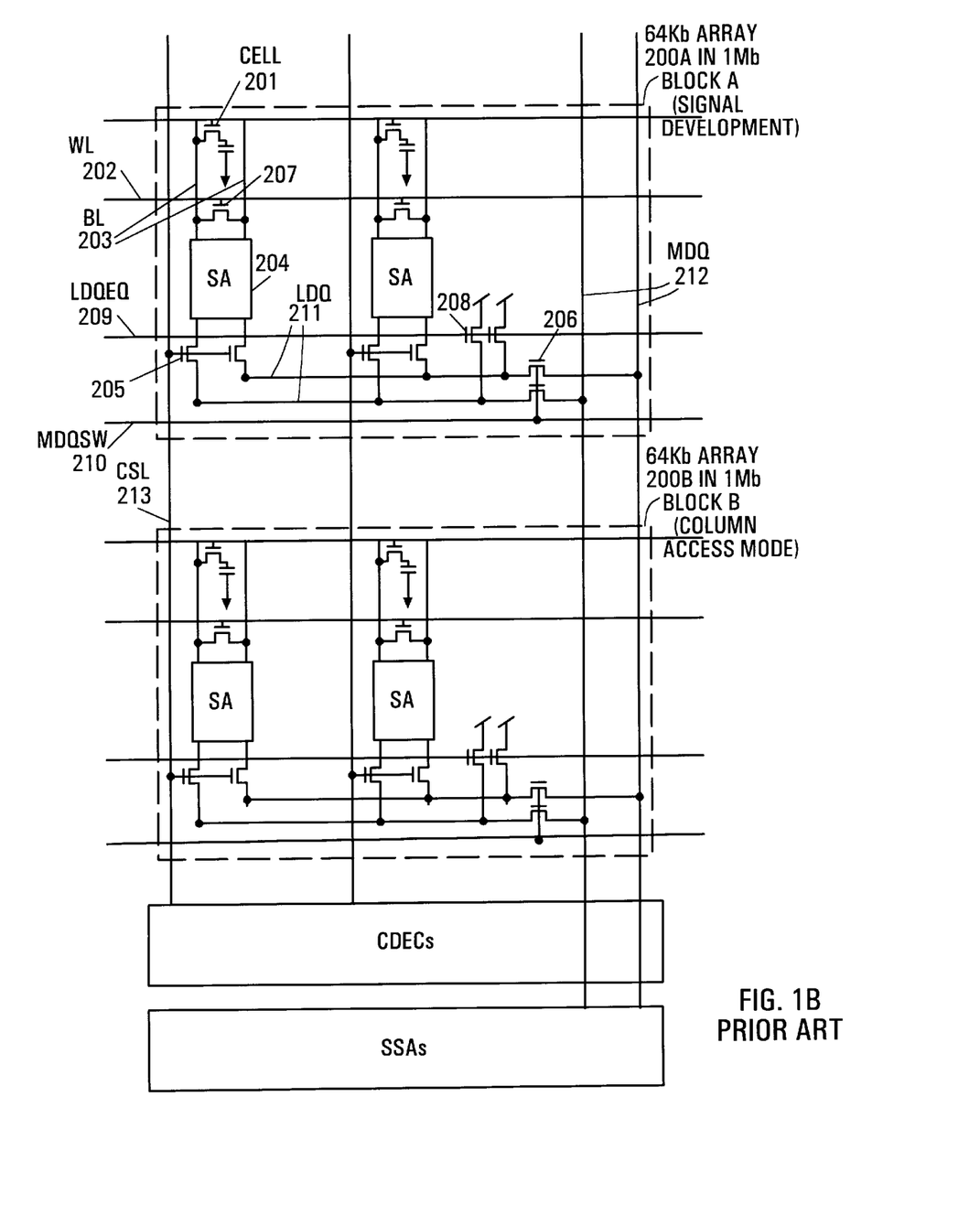
FIG. 1b is a detailed schematic diagram of a prior art CSL architecture for a single bank DRAM, showing two out of sixteen 64 Kb arrays representing two blocks A and B.

FIG. 1b shows a more detailed schematic of the 1 Mb segment 102 depicted in FIG. 1a, wherein two sixteen 64 Kb arrays 200A and 200B out of 16 are illustrated. 200A and 200B are, respectively, the intersection area between the block 101A and the segment 102, and the intersection area between the block 101B and the segment 102 (FIG. 1a). The 64 Kb array consists of 512 WLs 202 and 128 BL pairs 203. As discussed previously, 32 CSLs 213, 4 LDQ pairs 211, and 4 MDQ pairs 212, are arranged over this 1 Mb segment. (For simplicity sake, FIG. 1b is shown to include only 1 out of 4 of each of the features BLs, LDQs, and MDQs, comprising this arrangement.) When one of the 32 CSLs 213 are activated, 4 of the 128 BL pairs 203 are coupled to the corresponding 4 LDQ pairs 211 and 4 MDQ pairs 212. The detailed operation of a single bank DRAM and problems relating to a multi-bank DRAM are described next.

When in standby mode (i.e., when no WL 202 and no CSL 213 are active, resulting in no data being written in or read out of the memory), all BLs 203 and LDQs 211 are precharged to ½ the value of the power supply Vdd. MDQs 212 are precharged to the Vdd level. When a 1 Mb block A is selected, BL equalizers 207 and MDQ equalizers 208 are disabled first. MDQ lines 212 are coupled to LDQ 211 through MDQ transistor 206. This allows LDQ 211 to be pre-charged to the value of Vdd. WL 202 then rises to read data from cell 201. Sense amplifiers (SA) 204 are activated only after the signal has been sufficiently developed (typically, 90%) on BLs 203. CSL 213 rises to transfer data from selected BL 203 pair to the respective pairs, LDQ 211 and MDQ 212, for a read mode (or inversely, for a write mode). BLs and LDQs in an unselected 1 Mb block B are kept at ½ Vdd's pre-charged level, since the BL and LDQ equalizers are 'on', while the MDQ transistor 206 remains 'off'. This organization allows CSLs 213 to be shared between the 1 Mb blocks A and B, requiring only one column decoder for each 16 Mb unit, preferably located at the bottom of each 16 Mb unit.

The MDQ architecture suffers from a fundamental deficiency, in the instance when A and B 1 Mb banks are operated as two separate entities. By way of example, if the 1 Mb block A is in a 'signal development mode' (i.e., when data is read out of a memory cell and transferred to the bitline), the 1 Mb block B may be in a 'column access mode' (i.e., the time it takes to read or write data to a cell). Because the CSLs are shared between banks A and B, the column switch transistor 205 in array 200A, now in the signal development phase, is also activated, thereby destroying the data in cell 201 in array 200A. Column switch transistor 205 must remain in the off state during the signal development mode in order not to destroy the data. The exact timing when the signal development phase starts and the timing when the column transistor phase opens cannot be internally predicted because they are externally controlled by the system designer and/or by customer constraints. To overcome this problem, three solutions, embodied in more advanced architectures, to be described hereinafter, have been advanced.

In a first solution (not shown in the drawings) described in an article published in the IEEE Journal of Solid-State Circuits, Vol. 31, No. 11, pp. 1656–1668, entitled: "A 2.5 ns Clock Access, 250 MHz, 256 Mb SDRAM with Synchronous Mirror Delay", by T. Saeki, et al., four banks are configured having four units, each of which is controlled by its own independent column decoders. Since the CSLs are not shared among the various banks, the problem previously described is bypassed. However, the number of banks configured in the chip is limited by the number of units present, which is not adequate for configurations of 16 or more banks, which are required for a 1 Gb DRAM design.

Figure 1C:
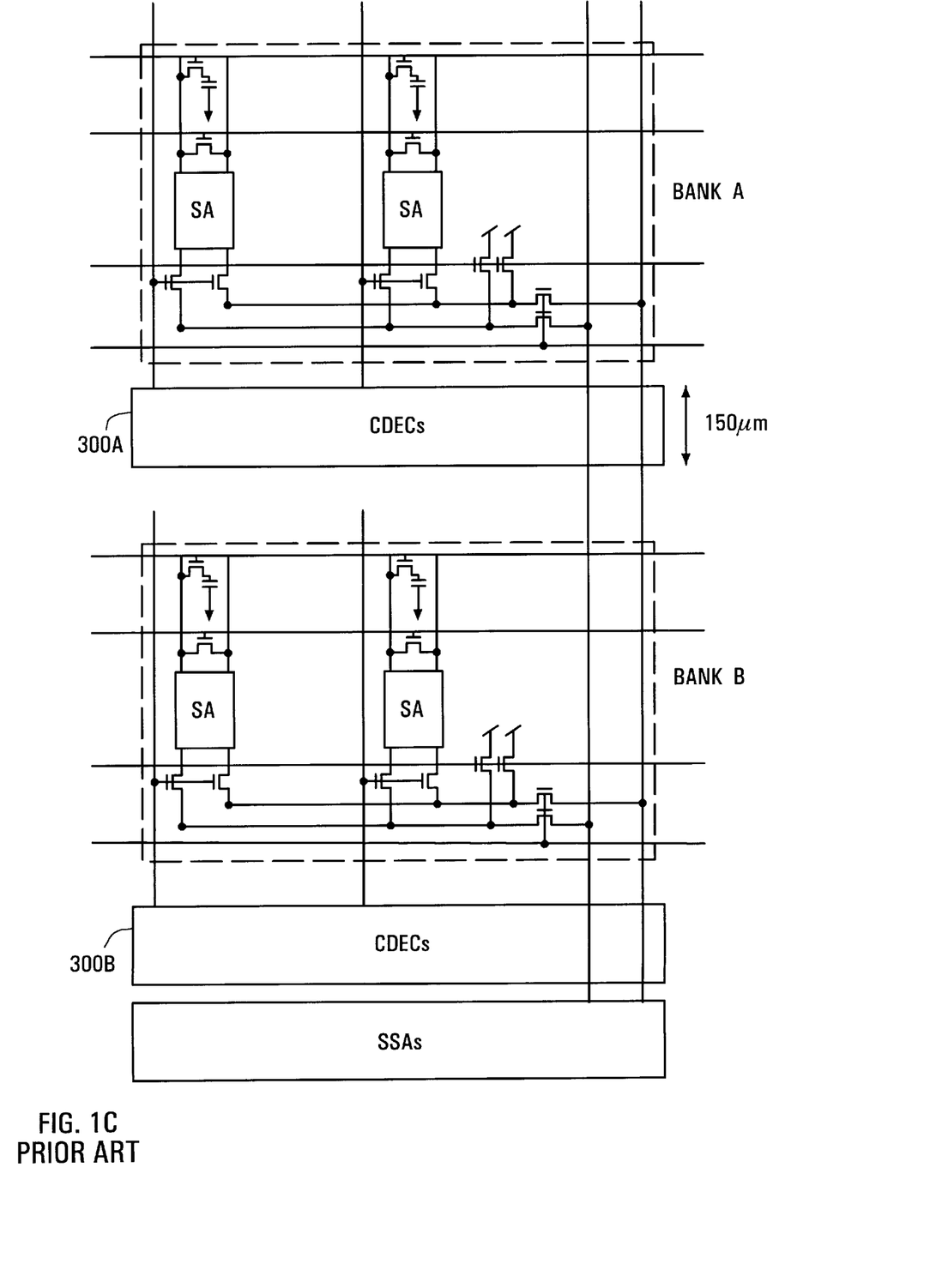
FIG. 1c shows a prior art CSL architecture having two independent full column decoders for a multi-bank DRAM, respectively controlling banks A and B.

In a second solution, illustrated in FIG. 1c, two column decoders 300A and 300B are shown, respectively controlling banks A and B. More specifically, the CSLs in the corresponding bank are independently controlled by full column decoders 300A and 300B. However, by duplicating the number of full column decoders, a substantial penalty in added chip real estate is imposed on the designer as, for instance, by increasing the height of the 16 Mb unit by ~150 μm for the two banks A and B (and 150 μm for each additional bank).

Figure 1D:
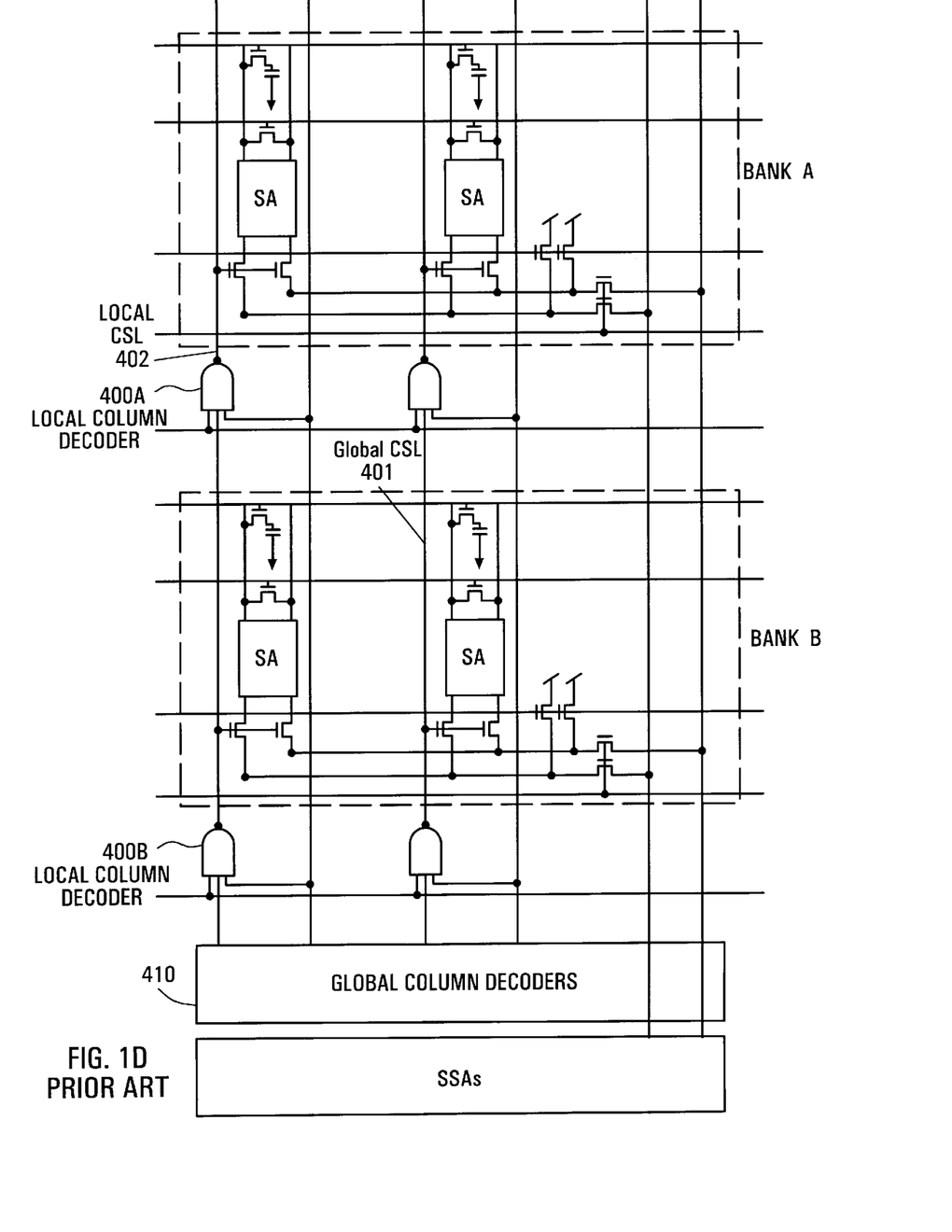
FIG. 1d shows a schematic diagram of a prior art, merged bank architecture for an (MBA) DRAM chip.

A third solution to the aforementioned problem pertaining the MDQ architecture, and which is commonly referred to as a "merged bank architecture" (MBA), is illustrated in FIG. 1d. Rather than using full column decoders 410 for each of the banks A and B, partial local column decoders 400A and 400B are added instead. Partial local column decoders 400A are driven by global column decoders 410. Since partial column decoders (400A and 400B) are smaller than full column decoders, the area penalty can be substantially reduced. However, this approach requires extra interconnecting wires (i.e., twice as many) for global CSL 401 and local CSL 402, which are difficult to accommodate within the limited space available. Details of this architecture may be found in an article published in the IEEE Journal of Solid-State Circuits, Vol. 31, No. 11, pp. 1635–1644, entitled: "A 32 -Bank 1 Gb Self-Strobing Synchronous DRAM with 1 GByte/s Bandwidth", by Jei-Hwan Yoo, et al.

OBJECTS OF THE INVENTION

Accordingly, it is an object of the invention to build a DRAM having at least two banks within a unit forming the DRAM with a minimum amount of circuitry.

It is another object of the invention to design a DRAM by configuring a plurality of banks within each unit forming the DRAM.

It is another object of the invention to have a DRAM provided with at least two banks utilize a Master DQ architecture, while minimizing the amount of circuitry to achieve such a design.

It is still another object of the invention to protect a multi-bank DRAM having an Master DQ architecture from destroying data stored in a cell.

It is yet another object of the invention to have a multi-bank DRAM be provided with at least one global CSL lines and a plurality of bank CSLS.

It is a more particular object of the invention to have a multi-bank DRAM be provided with a CSL architecture, wherein bank CSL lines are shared by some of the banks but not by the others, and wherein the global CSL is shared by all the banks.

It is further another object of the invention to have the design of the multi-bank CSL oriented, MDQ architecture DRAM, with a minimum amount of interconnecting wires.

It is a still a further object of the invention to have a multi-bank DRAM be provided with a CSL architecture to be controlled by global column decoders and by bank column decoders.

It is a yet a further object of the invention to have a multi-bank DRAM be controlled by a single column decoder block.

SUMMARY OF THE INVENTION

The shortcomings of the prior art are overcome and additional advantages are realized through the provision of a multi-bank DRAM architecture having at least one global CSL lines and a plurality of bank CSLs. The DRAM is provided with a CSL architecture, in which the bank CSL lines are shared by some of the banks but not by others, and wherein the global CSL is shared by all the banks. The CSL architecture of the DRAM is controlled by global column decoders and by bank column decoders.

In another aspect of the invention, the design of the multi-bank CSL oriented, MDQ architecture DRAM, is controlled by a single column decoder block, consisting of global column decoders and local column decoders.

In one embodiment, a DRAM is provided with a plurality of memory cells which are organized in at least two banks. Each of the banks consists of memory cells which are arranged in rows and columns. The memory cells store data provided by at least one bit line and at least one data line. The DRAM of the invention includes: a first switch for selecting one of the two banks; and a second switch connected to the first switch for selecting one of the columns, wherein the first and second switches couple one of the bit lines to one of the data lines, enabling data to be written into or read out of memory cells common to the selected bank and to the selected column.

In a second embodiment, a DRAM consists of at least two banks. Each of the two banks includes a plurality of blocks.

Each of the blocks is formed by memory cells arranged in rows and columns. The memory cells store data provided by at least one bit line and at least one data line. The DRAM includes: a first switch for selecting one of the at least two banks; a second switch connected to the first switch for selecting one of the columns; and a third switch connected to the second switch for selecting one of the blocks in each of the at least two banks, wherein the first, second, and third switches couple one of the bit lines to one of the data lines, enabling data to be written into or read out of memory cells common to the selected bank and to the selected column.

In a third embodiment, a DRAM consists of at least two banks. Each of the banks is formed by memory cells which are arranged in rows and columns. The memory cells store data provided by at least one bit line and at least one data line. The DRAM includes: a first switch for selecting one of the columns within the first bank of the at least two banks and for coupling one of the bit lines within the first bank to one of the data lines; and a second switch for selecting one of the columns within the second bank of at least two banks and for coupling one of the bit lines within the second bank to one of the data lines, wherein the first and the second switches are controlled by two independent column select lines, and wherein the first of the two column select lines spans over both of the banks, and the second of the two column select lines spans over one of the at least two banks.

Other embodiments and aspects of the invention are described in detail herein and are considered part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features and advantages of the invention will be apparent from the following detailed description taken in conjunction with the accompanying drawings in which:

DETAILED DESCRIPTION OF THE INVENTION

It is known in the art that data could be destroyed in a cell if a column switch transistor were to open while a signal is in the process of being generated. This is a fundamental problem in multi-bank DRAM designs with Master-DQ architecture, wherein CSLs are shared between several banks. This invention overcomes the problem with global CSLs (GCSL) and bank CSLs (BCSL), providing a promising architecture for giga-bit scale DRAMs and embedded DRAM macros.

Figure 2:
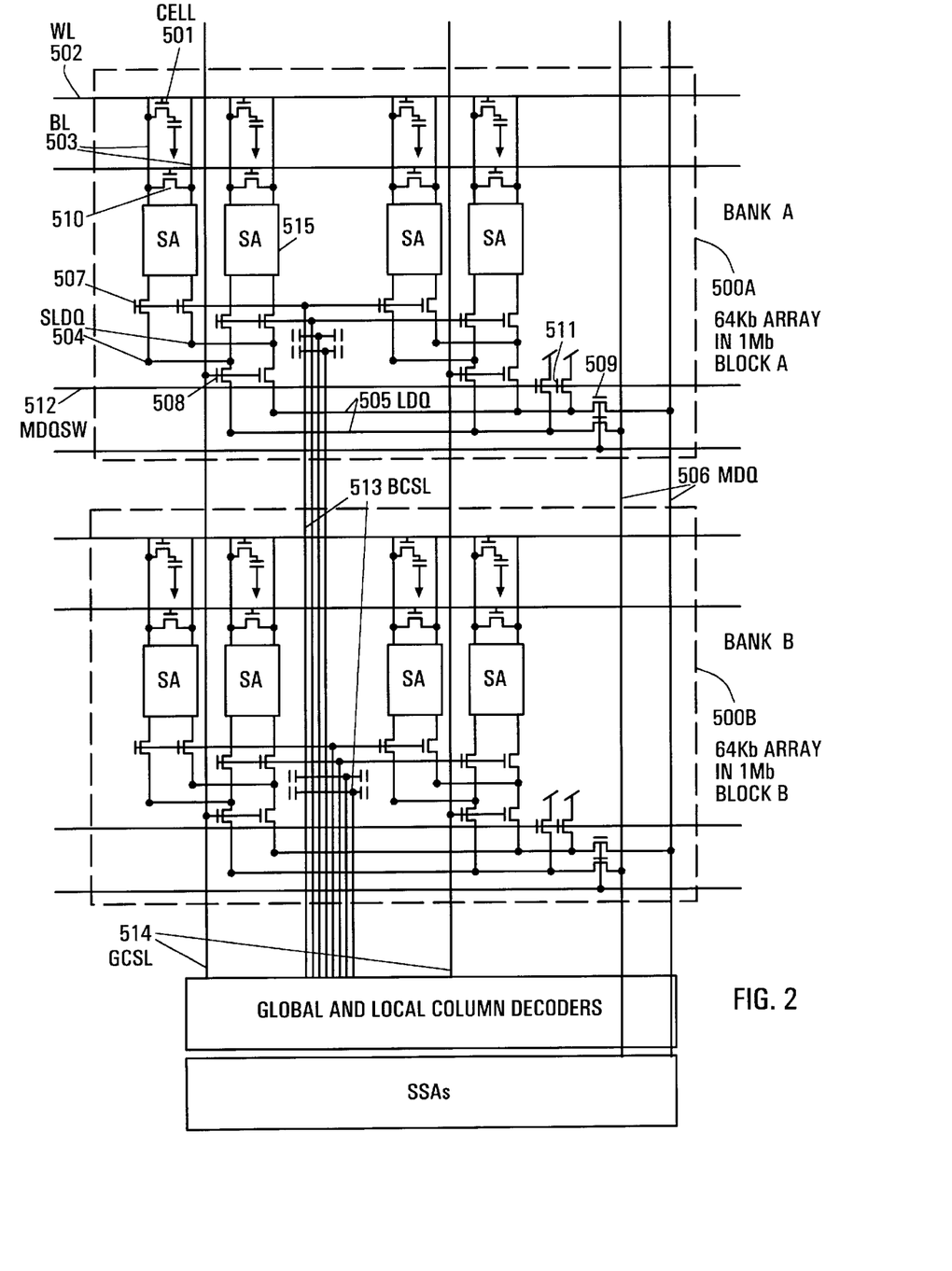
FIG. 2 is a schematic diagram of a Hierarchical CSL architecture applicable to four banks within a 16 Mb unit, wherein the bank CSLs are allocated vertically, in accordance with a first embodiment of the present invention.

Referring to FIG. 2, there is shown a CSL architecture, according to the invention, which is illustrated to a memory having four banks within a 16 Mb unit, and which, only two are shown therein for simplicity purposes. Instead of using 32 CSLs in one segment 102 (as was shown in FIG. 1a), eight global column select lines (GCSL) 514 and four groups of four bank column select lines (BCSL) 513 (for a total of 16 BCSLs) are assigned to each segment. A first pair of NMOS (or, alternatively PMOS) transistors 507 couples each BL pair 503 to sub-local DQ 504 (or SLDQ 504) to form a first stage column switch. A second pair of NMOS transistors 508 couples SLDQ 504 to local DQ 505 (or LDQ 505) to form a second stage column switch. The first pair of NMOS transistors 507 is controlled by the corresponding four sets of four bank CSLs 513 (or BCSL 513, for a total of 16. The third pair of NMOS transistors 509 couples LDQ 505 to Master DQ 506 (or MDQ 506) to form the MDQ switch. BCSLs 513 are shared within the same bank, although not shared with other banks). Likewise, the second pair of NMOS transistors 508 is controlled by the corresponding 1 out of 8 GCSLs 514. The GCSLs are shared by all banks. In any given bank, BCSLs 513 can be independently controlled, disabling the column switch even when GCSL is enabled for a column operation of a different bank. The total number of GCSLs and BCSLs equals:

8 GCSLs+16 BCSLs/segment, substantially less than that required by a conventional MDQ architecture (i.e., 32 CSLs/segment). This allows GCSLs 514 and BCSLs 513 to be laid out over the array in the same manner as in a conventional MDQ architecture, while relaxing the pitch by 25%.

The detailed operation of the arrangement shown in FIG. 2 will now be discussed.

It is assumed that initially, bank A is in a stand-by mode, whereas bank B is in a column access mode. While bank A is in stand-by mode, all BLs 503 and LDQs 505 (in bank A) are pre-charged to ½ the value of Vdd. When bank A is enabled (i.e., entering the signal development mode), BL equalizers 510 and MDQ equalizers 511 are disabled first in a conventional manner. MDQ transistors 509 are opened, forcing the LDQ follow the MDQ voltages. Note that the MDQs and the GCSLs are now used by bank B when B is in the column access mode. WL 202 then rises to read data from cell 501.

Upon completion of the bank signal development mode, (i.e., after that data from the cell to the bitline 503 has been transferred), sense amplifiers (SA) 515 are activated. Until the column access mode is initiated for bank A, the BCSLs 513 of bank A remain at a low, thereby avoiding data destruction from incurring, even if GCSL 514 is activated for bank B while it is in the column access mode.

When the column access mode is enabled for bank A, 1 out of 4 BCSLs 513 coupled to bank A is enabled. Note that MDQs 506 and GCSLs 514 are now used for bank A, allowing amplified cell data 501 in bank A to be transferred through sub-LDQ (SLDQ) 504, LDQ 505, and MDQ 506 when in a read mode, or vise-versa when in a write mode. While bank A is in a column access mode, BCSLs 513 in bank B remain at a low.

This architecture allows GCSLs 513 to be shared between the various banks, requiring only one column decoder/16 Mb unit. Column decoders which generate GCSLs and BCSLs are, preferably, laid out at the bottom of the unit to minimize the silicon area penalty. The number of NMOSs 508 connected to the LDQ is ¼ that of a conventional MDQ architecture, thereby substantially reducing the LDQ capacitance. Indeed, the SLDQ 504 capacitance is only about 10 fF, which can easily be driven by one sense amplifier (SA), overcoming any potential data destruction due to charge sharing between the BLs and SLDQ.

Optionally, MDQ switch 509 can be eliminated by directly coupling LDQ 505 to MDQ 506, provided the BCSLs 513 are not shared with other 1 Mb blocks 500 within the same bank. In this instance, BCSLs 513 are fully independently controlled for the corresponding 1 Mb blocks 500, all of which are controlled by the column decoder, preferably located at the bottom of the unit.

Figure 3:
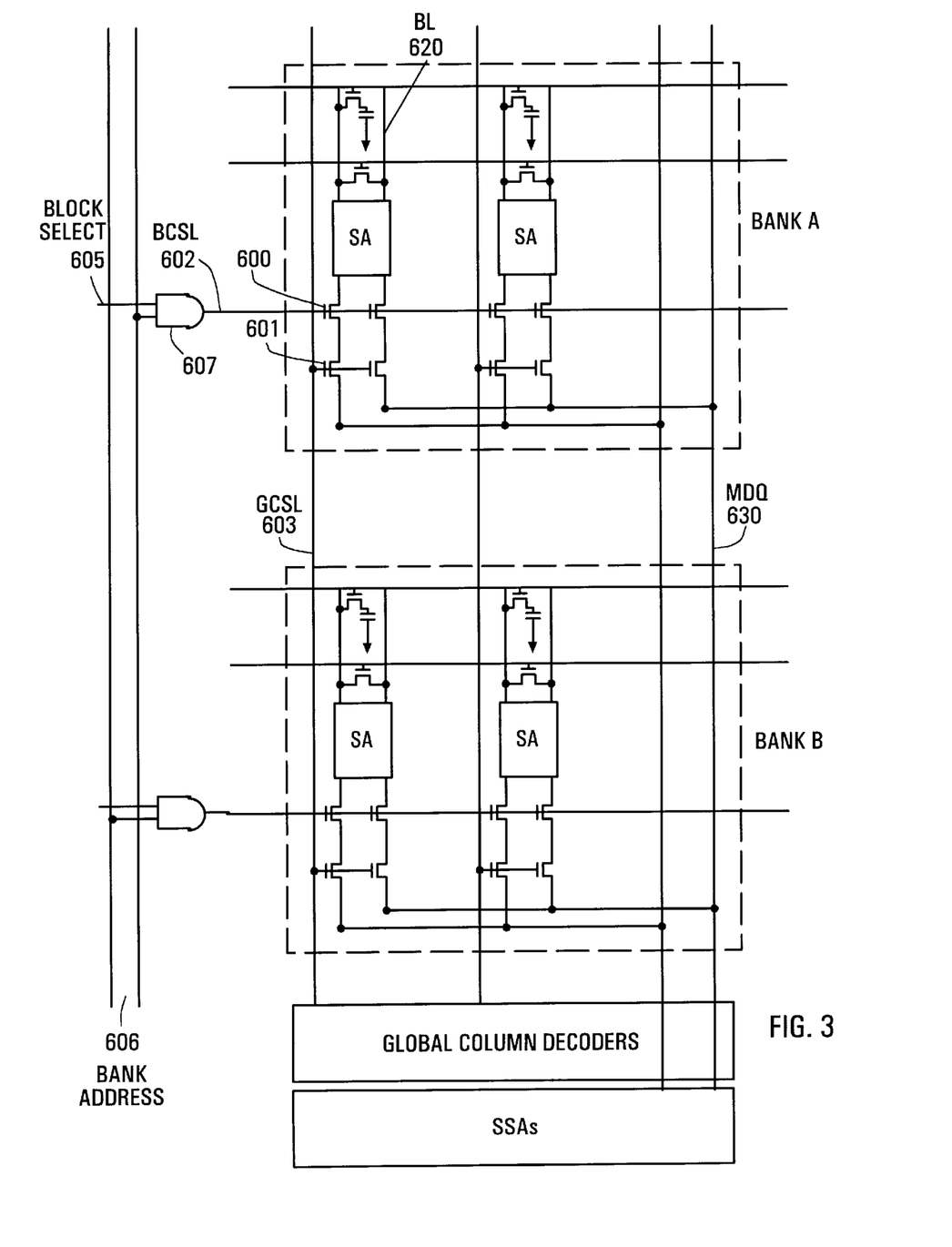
FIG. 3 is a schematic diagram of a Hierarchial CSL architecture applicable to four banks within a 16 Mb unit, wherein the bank CSLs are allocated horizontally, in accordance with a second embodiment of the present invention.

A second embodiment of the invention is illustrated in FIG. 3. Instead of allocating the BCSLs 402 vertically shown in FIG. 2, BCSLs 602 are distributed horizontally. Two series of NMOSs transistors 600 and 601 are used to read/write data from BLs 620 cell to MDQs 630, in an arrangement similar to the one described in the previous embodiment, although SLDQs and LDQs may be dispensed of altogether. NMOSs 601 are controlled by the globally shared CSL (GCSL), exactly as in the previous case.

The decoded signals in the BCSLs are determined by bank address 606 and block select signal 605. BCSL is only activated when both, the block and the bank are selected. The block select is not enabled until the signal development phase is complete, disabling NMOS 600. This allows bank B to remain in column access mode, while bank A remains in signal development mode. Optionally, the decoded signal can be used for the bank select signal, which decodes the column address, bank address, and block select. The drawback of this embodiment compared to the previous one is that the capacitance loading of the BCSL is substantially larger, resulting in a slower operation.

Figure 4:
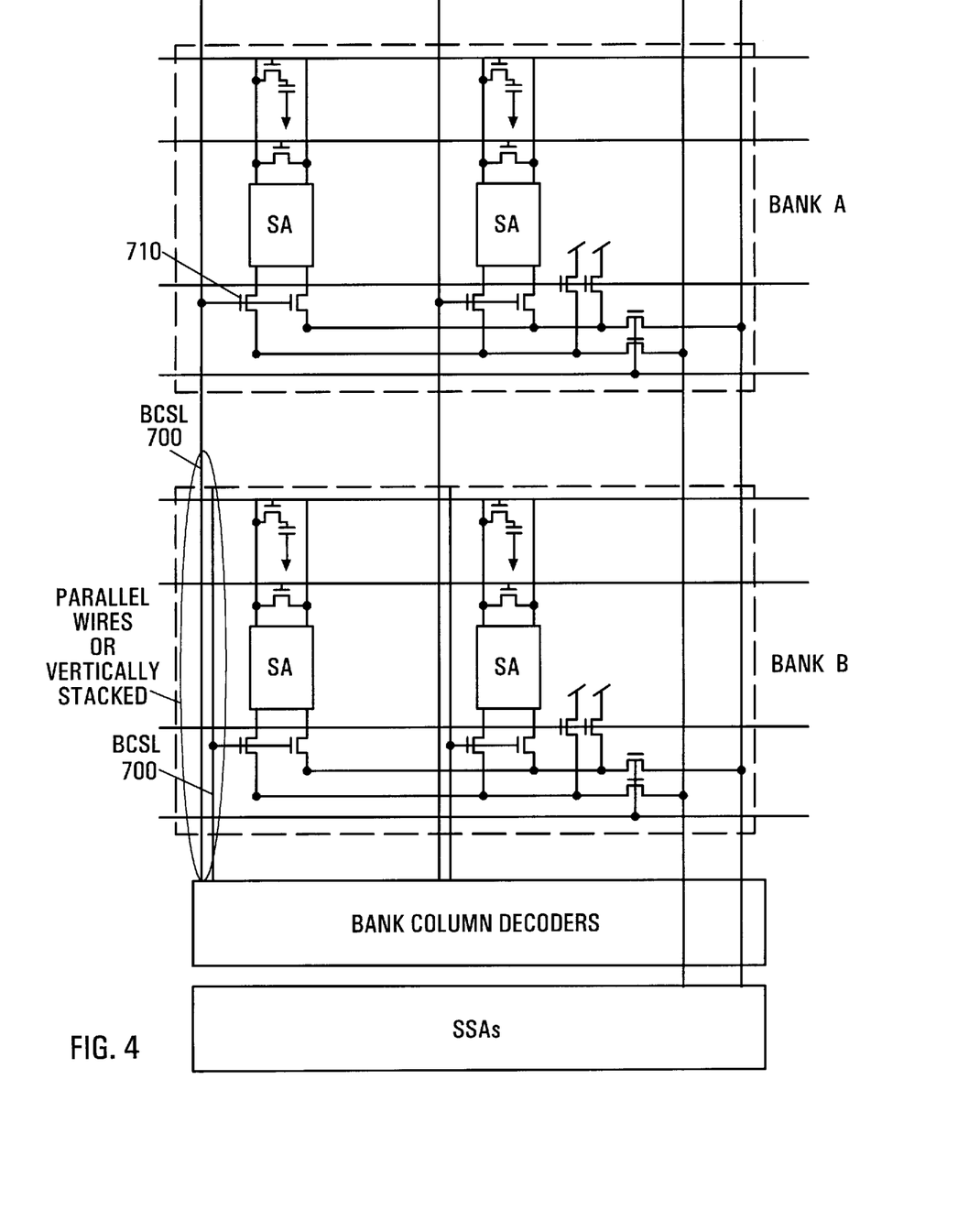
FIG. 4 shows a schematic diagram of a CSL architecture applicable to four banks within a 16 Mb unit, wherein no global CSL is required altogether and all the bank CSLs within each corresponding bank act independently of each other, in accordance with a third embodiment of the present invention.

FIG. 4 shows a third embodiment of the invention. In this embodiment, there is no need to have a GCSL. In each bank, all BCSLs 700 are independent of the BCSL located in another bank. Unlike the prior art architecture shown in FIG. 1b, all column decoders are, preferably, laid out at the bottom of the unit. NMOSs 710 are controlled by the bank independent CSL, allowing bank A to be in the signal development mode, while the bank B is in the column access mode. This embodiment, however requires substantially more interconnecting wires to accommodate the BCSLs independently. Practitioners of the art will fully realize that additional metal could be used to bypass the BCSLs in the upper array, thereby making it possible to contain the layout within the given space.

While the present invention is described in terms of preferred embodiments, it is understood that numerous variations and modifications will occur to a person skilled in the art without departing in spirit from the claimed invention. It is intended that the scope of the claims include those modifications and variations that fall within the spirit of the invention.

What is claimed is:

1. A dynamic random access memory including at least two banks, each of said banks including memory cells arranged in rows and columns, said memory cells storing data provided by at least one bit line and by at least one data line, the dynamic random access memory comprising:

first decoding means for selecting one of at least two bank column select lines (BCSL 513);

second decoding means for selecting at least one global column select line (GCSL 514);

first switching means (507) controlled by said at least two bank column select lines (BCSL 513), for coupling at least one bitline pair (BL 503) to at least one pair of first data lines (SLDQ 504); and second switching means (508) controlled by said at least one global column select line (GCSL 514) for coupling said at least one pair of first data lines (SLDQ 504) to at least one pair of second data lines (MDQ 506), thereby enabling data to be written into or read out of said at least one bitline pair (BL 503) to said at least one pair of second data lines (MDQ 506).

2. The dynamic random access memory of claim 1 wherein said first decoding means decodes an address in one of said at least two banks.

3. The dynamic random access memory of claim 2, wherein said first decoding means further decodes another address which is unrelated to said at least two banks.

4. The dynamic random access memory of claim 2, wherein said first decoding means is arranged vertically over at least one of said two banks along said rows.

5. The dynamic random access memory of claim 2, wherein said first decoding means is arranged horizontally over at least one of said two banks along said columns.

6. The dynamic random access memory of claim 1, wherein said first and said second switching means are selected from the group consisting of a pair of NMOS devices and a pair of PMOS devices.

7. The dynamic random access memory of claim 6, wherein said pair of NMOS or said pair of PMOS devices forming said first switching means have a gate which is coupled to said bank column select line, a source and a drain which are respectively coupled to said at least one bitline (BL 503) and to at least a first data line (SLDQ 504).

8. The dynamic random access memory of claim 6, wherein said pair of NMOS or said pair of PMOS devices forming said second switching means have a gate which is coupled to said global column select line, a source and a drain which are respectively coupled to said at least one bitline (BL 503) and to at least a second data line (SLDQ 504).

9. A dynamic random access memory including at least two banks, each of said banks including memory cells arranged in rows and columns, said memory cells storing data provided by at least one line and by at least one data line, the dynamic random access memory comprising:

first decoding means for selecting one of at least two bank column select lines (BCSL 513);

second decoding means for selecting at least one global column select line (GCSL 514);

third decoding means for selecting a master data selection switch line (MDQSW 512);

first switching means (507) controlled by said at least two bank column select lines (BCSL 513) for coupling at least one bitline pair (BL 503) to at least one pair of first data lines (SLDQ 504);

second switching means (508) controlled by said at least one global column select line (GCSL 514) for coupling said at least one pair of first data lines (SLDQ 504) to at least one pair of second data lines (LDQ 505); and third switching means controlled by said at least master data selection switch line (MDQSW 513) for coupling said at least one pair of second data lines (LDQ 505) to at least one pair of third data lines (MDQ 506), thereby enabling data to be written into or read out of said at least one bitline pair (BL 503) to said at least one of pair of third data lines (MDQ 506).

10. The dynamic random access memory of claim 9, wherein said global column select line is generated by a decoder which decodes an address in one of said columns.

11. The dynamic random access memory of claim 9, wherein said first decoding means decodes an address in one of said at least two banks.

12. The dynamic random access memory of claim 11, wherein said first decoding means further decodes another address which is unrelated to said at least two banks.

13. The dynamic random access memory of claim 9, wherein said third switching means is controlled by a block select line.

14. The dynamic random access memory of claim 13, wherein said block select line is generated by a decoder which decodes an address in one of said blocks within each of said at least two banks.

15. The dynamic random access memory of claim 14, wherein said decoder, which decodes an address in one of said blocks, also decodes another address which is unrelated to said block address.

16. A dynamic random access memory including at least two banks, each of said banks including memory cells arranged in rows and columns, said memory cells storing data provided by at least one bit line and at least one data line, the dynamic random access memory comprising:

first switching means for selecting one of said columns within said first bank of at least two banks and for coupling one of said bit lines within said first bank to one of said data lines; and second switching means for selecting one of said columns within said second bank of at least two banks and for coupling one of said bit lines within said second bank to one of said data lines, wherein said first and said second switching means are controlled by two independent column select lines, and wherein the first of said two column select lines spans over both of said banks and the second of said two column select lines spans over one of said at least two banks.

17. The dynamic random access memory of claim 16, wherein the first of said two independent column select lines is generated by a first decoder which decodes an address in one of said at least two banks, and the second of said two independent column select lines is generated by a second decoder which decodes an address in the second of said at least two banks.

18. The dynamic random access memory of claim 17, wherein said two independent column select lines are positioned parallel to said columns over said at least two banks.

19. The dynamic random access memory of claim 17, wherein said first and second decoders are located next to each other.

* * * * *